United States Patent
Kim et al.

(10) Patent No.: US 8,163,627 B2
(45) Date of Patent: Apr. 24, 2012

(54) METHOD OF FORMING ISOLATION LAYER OF SEMICONDUCTOR DEVICE

(75) Inventors: Jung Geun Kim, Seoul (KR); Eun Soo Kim, Incheon-si (KR); Seung Hee Hong, Seoul (KR); Suk Joong Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 502 days.

(21) Appl. No.: 11/955,881

(22) Filed: Dec. 13, 2007

(65) Prior Publication Data

US 2009/0004817 A1 Jan. 1, 2009

(30) Foreign Application Priority Data

Jun. 27, 2007 (KR) ........................ 10-2007-0063589

(51) Int. Cl.
*H01L 21/76* (2006.01)
(52) U.S. Cl. ........................ 438/435; 257/499
(58) Field of Classification Search .................. 438/435; 257/499
See application file for complete search history.

(56) References Cited

U.S. PATENT DOCUMENTS

| | | | | |
|---|---|---|---|---|
| 2002/0132101 A1* | 9/2002 | Fonash et al. | ............... | 428/304.4 |
| 2003/0013271 A1* | 1/2003 | Knorr et al. | .................... | 438/435 |
| 2004/0198019 A1* | 10/2004 | Yasui et al. | .................... | 438/435 |
| 2007/0148927 A1* | 6/2007 | Kim | ............................... | 438/510 |
| 2007/0212874 A1* | 9/2007 | Sandhu | .......................... | 438/637 |
| 2008/0001249 A1* | 1/2008 | Sheen et al. | ................... | 257/499 |
| 2008/0014710 A1* | 1/2008 | Bian et al. | ...................... | 438/424 |
| 2008/0121972 A1* | 5/2008 | Shiozawa et al. | ............. | 257/316 |

FOREIGN PATENT DOCUMENTS

| | | |
|---|---|---|
| KR | 100556527 B1 | 2/2006 |
| KR | 1020060076517 A | 7/2006 |
| KR | 1020060105857 A | 10/2006 |
| KR | 1020070059732 A | 6/2007 |

* cited by examiner

*Primary Examiner* — Thao Le
*Assistant Examiner* — Geoffrey Ida
(74) *Attorney, Agent, or Firm* — Marshall, Gerstein & Borun LLP

(57) ABSTRACT

A method of forming an isolation layer of a semiconductor device is disclosed herein, the method comprising the steps of providing a semiconductor substrate in which a tunnel insulating layer and a charge storage layer are formed on an active area and a trench is formed on an isolation area; forming a first insulating layer for filling a lower portion of the trench; forming a porous second insulating layer on the first insulating layer for filling a space between the charge storage layers; forming a third insulating layer on a side wall of the trench and the second insulating layer, the third insulating layer having a density higher than that of the second insulating layer; and forming a porous fourth insulating layer for filling the trench.

19 Claims, 4 Drawing Sheets

METHOD OF FORMING ISOLATION LAYER OF SEMICONDUCTOR DEVICE

CROSS-REFERENCE TO RELATED APPLICATIONS

The priority of Korean Patent Application No. 10-2007-0063589 filed on Jun. 27, 2007, is hereby claimed, and its disclosure is incorporated herein by reference in its entirety.

BACKGROUND OF THE INVENTION

The present invention relates to a method of forming an isolation layer of a semiconductor device, and more particularly relates to a method of forming an isolation layer of a semiconductor device for gap-filling a trench without generating a void.

As semiconductor devices become more highly integrated, the width of trenches becomes more narrow and the depth of trenches becomes more deep. As such, it is more difficult to completely gap-fill a trench with a conventional high density plasma (HDP) oxide layer to form an isolation layer, without generating a void. To solve the aforementioned problem, the material used for gap-filling the trench without generation of voids has been actively studied.

To solve the above-described problem, polysilazane (PSZ) material is placed in the trench to partially fill a lower portion of the trench, and high density plasma (HDP) oxide layers having a stacked structure are formed on the polysilazane (PSZ) material in a stacked structure to fill completely the trench.

However, if the high density plasma (HDP) oxide layers having a stacked structure are formed on polysilazane (PSZ) material in a stacked structure, since the high density plasma (HDP) oxide layer is porous, etchant solution can flow down to the polysilazane (PSZ) material through the porous high density plasma (HDP) oxide layers during a subsequent etching process. As a result, polysilazane (PSZ) material is exposed and a void is generated in the polysilazane (PSZ) material.

SUMMARY OF THE INVENTION

In the present invention, by forming an insulating layer having an etching selection ratio less than that of other material and a density greater than that of a high density plasma (HDP) oxide layer to prevent etchant solution from penetrating into the high density plasma (HDP) oxide layer in an etching process, the insulating layer being formed between the insulating layers formed of the porous high density plasma (HDP) oxide, it is possible to prevent etchant solution from flowing down to polysilazane (PSZ) material through the porous high density plasma (HDP) oxide layer during the subsequent etching process, and so the polysilazane (PSZ) material is not exposed and generation of a void in the polysilazane (PSZ) material is prevented.

In the method of forming an isolation layer in a semiconductor device according to one embodiment of the present invention, a semiconductor substrate in which a tunnel insulating layer and a charge storage layer are formed on an active area, and a trench is formed on an isolation area, is provided. A first insulating layer is formed for filling a lower portion of the trench. A porous second insulating layer is formed on the first insulating layer for filling a space between the charge storage layers. A third insulating layer is formed on a side wall of the trench and the second insulating layer, the third insulating layer having a density higher than that of the second insulating layer. A porous fourth insulating layer is then formed, filling the trench. The first, second, third, and fourth insulating layers together form the isolation layer.

In the above method, prior to forming the first insulating layer, a side wall insulating layer is formed on a side wall and a bottom surface of the trench, and a liner insulating layer is then formed for filling a lower portion of the trench. The first insulating layer is formed from polysilazane (PSZ) material, and the second insulating layer is formed of a high density plasma (HDP) oxide layer.

The third insulating layer preferably is formed in a thickness of 50 angstroms to 300 angstroms. The third insulating layer has a density sufficient to prevent etchant solution from penetrating down to the second insulating layer. The third insulating layer preferably is formed from nitride or oxide or has a structure formed by laminating nitride and oxide. For example, the oxide can be high temperature oxide (HTO) or low pressure tetra ethyl ortho silicate (LP-TEOS). The nitride can be, for example, low pressure-silicon nitride (LP-SiN). The third insulating layer preferably is formed at a temperature of 680 degrees Celsius to 780 degrees Celsius in a furnace. The fourth insulating layer preferably is formed of a high density oxide layer.

In the method of forming an isolation layer in a semiconductor device according to another embodiment of the present invention, a semiconductor substrate in which a tunnel insulating layer and a charge storage layer are formed on an active area, and a trench is formed on an isolation area, is provided. A liner insulating layer is formed on a surface of the trench. A first insulating layer is formed on the liner insulating layer for filling partially a lower portion of the trench. A porous second insulating layer is formed on the first insulating layer for filling a space between the charge storage layers. A third insulating layer is formed on a side wall of the trench and the second insulating layer, the third insulating layer having a density greater than that of the second insulating layer. A porous fourth insulating layer is formed for filling the trench, and the fourth insulating layer, the third insulating layer and the second insulating layer are etched by an etching process to form an isolation layer. The first, second, third, and fourth insulating layers together form the isolation layer.

In the above method, prior to forming the liner insulating layer, a side wall insulating layer is formed on a side wall and a bottom surface of the trench before forming the liner insulating layer. The liner insulating layer formed on a lower portion of the trench preferably has a thickness greater than that of the liner insulating layer formed on the side wall of the trench. The first insulating layer preferably is formed from polysilazane (PSZ) material, and the second insulating layer is formed of a high density plasma (HDP) oxide layer.

The third insulating layer preferably is formed in a thickness of 50 angstroms to 300 angstroms. The third insulating layer has a density sufficient to prevent etchant solution from penetrating into the second insulating layer. The third insulating layer preferably is formed from nitride or oxide or has a structure formed by laminating nitride and oxide. For example, the oxide can be high temperature oxide (HTO) or low pressure tetra ethyl ortho silicate (LP-TEOS). The nitride can be, for example, low pressure-silicon nitride (LP-SiN). The third insulating layer preferably is formed at a temperature in a range of 680 degrees Celsius to 780 degrees Celsius in a furnace. The fourth insulating layer preferably is formed of a high density oxide layer.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Figure 1A:
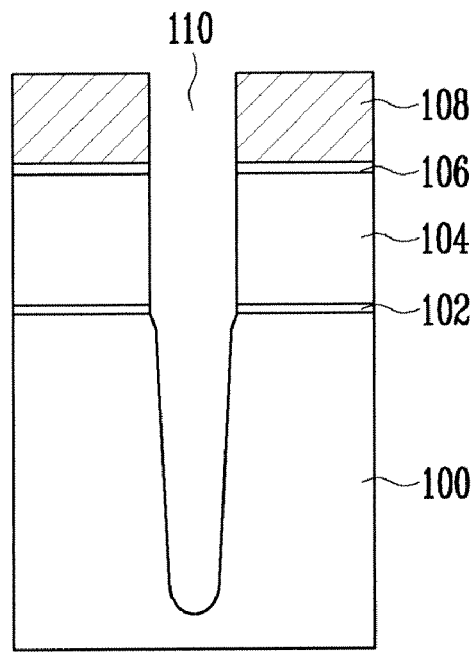
FIG. 1A to FIG. 1H are sectional views of a semiconductor device for illustrating a method of forming an isolation layer of a semiconductor device according to the present invention.

Hereinafter, the preferred embodiments of the present invention will be explained in more detail with reference to the accompanying drawings.

FIG. 1A to FIG. 1H are sectional views of a semiconductor device for illustrating a method of forming an isolation layer of a semiconductor device according to the present invention. Although the drawings illustrate that the present invention is applied to only the cell area, the processes shown in the drawings can also be performed on the peripheral area.

Referring to FIG. 1A, a tunnel insulating layer 102 and a first conductive layer 104 for a floating gate are formed sequentially on a semiconductor substrate 100. In this embodiment, the tunnel insulating layer 102 is formed from oxide and the first conductive layer 104 is formed of a polysilicon layer, although the invention is not so limited.

Next, a buffer insulating layer 106 and a hard mask layer 108 are formed on the first conductive layer 104. In this embodiment, the buffer insulating layer 106 is formed from oxide and the hard mask layer 108 is formed from nitride, although the invention is not so limited. The hard mask layer 108, the buffer insulating layer 106, the first conductive layer 104, the tunnel insulating layer 102 and the semiconductor substrate 100 are partially etched by an etching process to form an isolation trench 110.

Figure 1B:
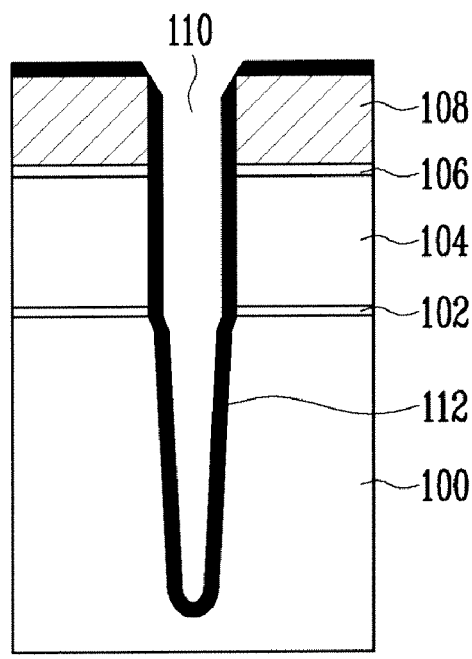

Referring to FIG. 1B, a side wall insulating layer 112 is formed on a surface of the semiconductor substrate 100 including the trench 110. In this embodiment, the side wall insulating layer 112 is formed from oxide, although the invention is not so limited. The side wall insulating layer 112 is formed for compensating the loss of the semiconductor substrate 100 generated during the etching process.

Figure 1C:
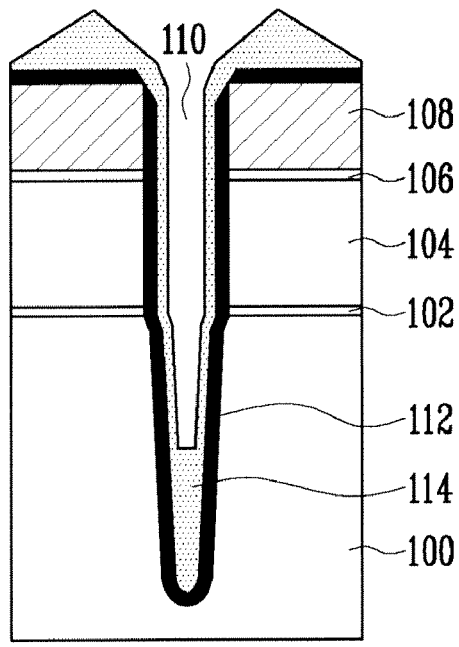

Referring to FIG. 1C, a liner insulating layer 114 is formed on the surface of the side wall insulating layer 112. In this embodiment, the liner insulating layer 114 is formed of a high density plasma (HDP) oxide layer and has a liner shape, although the invention is not so limited. In the liner insulating layer 114, a portion formed on a lower portion of the trench 110 is thicker than that formed on a side wall of the trench 110, and thus lower portion of the trench 110 is partially filled with the liner insulating layer 114.

Figure 1D:
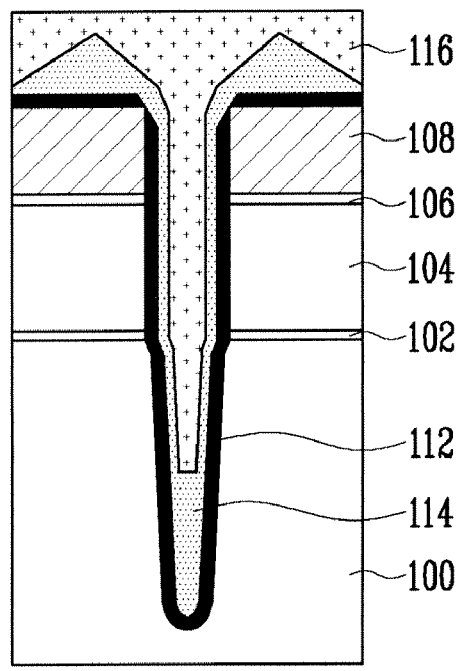

Referring to FIG. 1D, a first insulating layer 116 is formed on the semiconductor substrate 100 including the trench 110, for filling the trench 110. In this embodiment, the first insulating layer 116 is formed from polysilazane (PSZ) material and formed by a spin coating method, although the invention is not so limited.

Figure 1E:
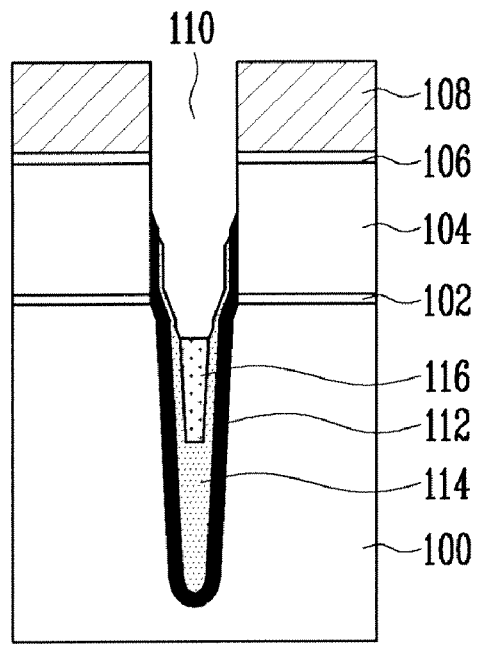

Referring to FIG. 1E, a chemical mechanical polishing (CMP) process is performed to remove the first insulating layer 116, the liner insulating layer 114, and the side wall insulating layer 112, until the hard mask layer 108 is exposed. The first insulating layer 116 remaining in the trench 110 is removed by a wet cleaning process. In this embodiment, the first insulating layer 116 is removed by solution of HF series. However, the first insulating layer partially remains below the tunnel insulating layer 102. When the process for removing the first insulating layer 116 is performed, the side wall insulating layer 112 and the liner insulating layer 114 formed on an upper portion and a side surface of the trench 110 are also removed. However, the side wall insulating layer and the liner insulating layer remain on a side surface of the liner conductive layer 104 at a certain height by means of a difference of etching selection ratio between two layers. That is, the above-described structure prevents an edge of the tunnel insulating layer 102 from being exposed.

Figure 1F:
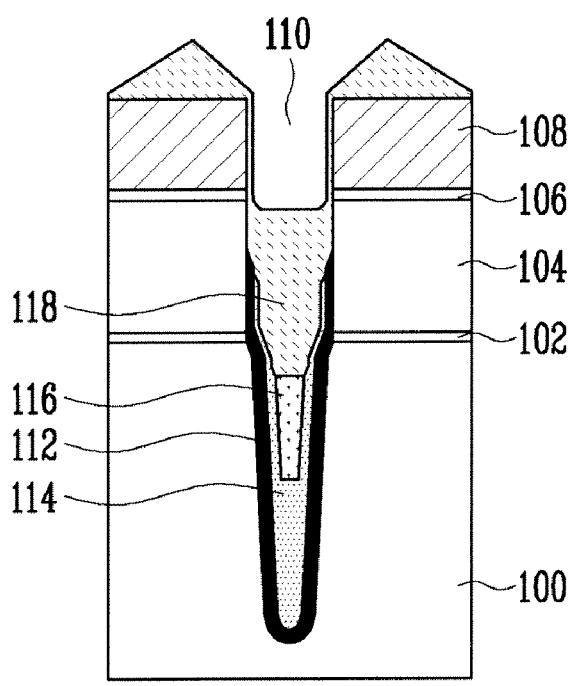

Referring to FIG. 1F, a second insulating layer 118 is formed on an upper portion of the trench 110 for partially filling the trench 110. In this embodiment, the second insulating layer 118 is formed of a high density plasma (HDP) oxide layer having porosity, although the invention is not so limited. The portion of the second insulating layer 118 formed on a lower portion of the trench 110 has a thickness greater than that of the portion of the second insulating layer formed on the side wall of the trench 110, and thus the second insulating layer 118 is formed to partially fill a lower portion of the trench 110.

Figure 1G:
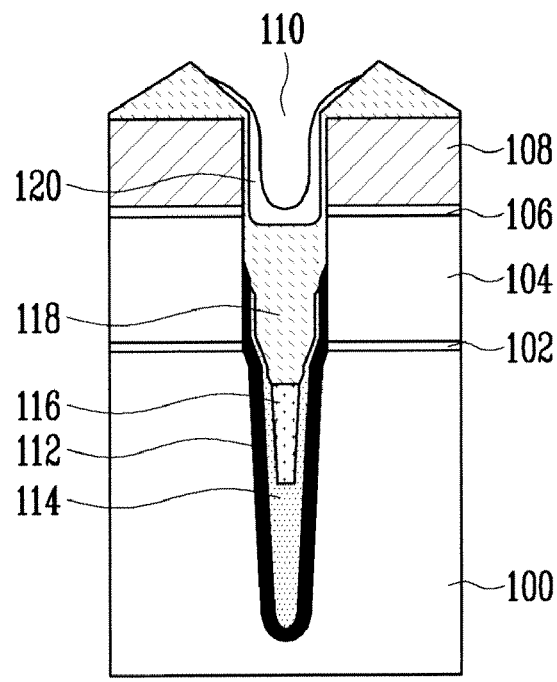

Referring to FIG. 1G, a third insulating layer 120 is formed on the second insulating layer 118. The third insulating layer 120 is formed from insulating material having an etching selection ratio lower than that of other material used in a wet etching process that is the subsequent process, being less influenced by the device profile and having a density denser than that of the second insulating layer 118, to prevent etchant solution from penetrating into the second insulating layer 118 in the subsequent etching process. For example, the third insulating layer 12 is formed in a thickness of 50 angstroms to 300 angstroms and is formed from nitride or oxide or has a structure formed by laminating nitride and oxide. It preferable that the oxide is high temperature oxide (HTO) or low pressure tetra ethyl ortho silicate (LP-TEOS) and the nitride is low pressure-silicon nitride (LP-SiN). The third insulating layer 120 preferably is formed at a temperature in a range of 680 degrees Celsius to 780 degrees Celsius in a furnace.

Next, the third insulating layer 120 is etched through an etching process to leave the third insulating layer on a side wall and a bottom surface of the trench 110.

Figure 1H:
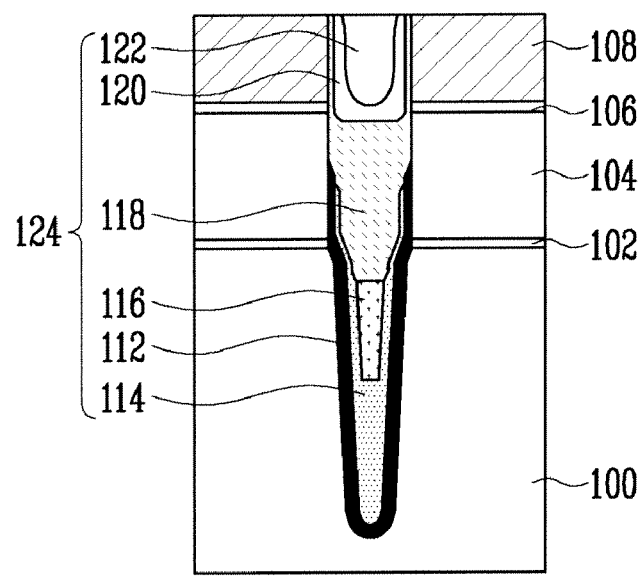

Referring to FIG. 1H, a fourth insulating layer 122 is formed on the semiconductor substrate 100 including the trench 110 to completely fill the trench 110. In this embodiment, the fourth insulating layer 122 is formed of a porous high density plasma (HDP) oxide layer, although the invention is not so limited. By forming the third insulating layer 120 between the second insulating layer 118 and the fourth insulating layer 122 formed of porous high density plasma (HDP) oxide layers, it is possible to prevent etchant solution from flowing down to the polysilazane (PSZ) material (that is, the first insulating layer 116) through the porous high density plasma (HDP) oxide layers (that is, the second insulating layer 118 and the fourth insulating layer 122) during the subsequent etching process, and so the polysilazane (PSZ) material is not exposed and generation of a void in the polysilazane (PSZ) material is prevented.

Next, a chemical mechanical polishing (CMP) process is performed until the hard mask layer 108 is exposed, to form an isolation layer 124. By forming the isolation layer 124, an active area and an isolation area become defined.

As described above, by forming the third insulating layer 120 between the second insulating layer 118 and the fourth insulating layer 122 formed of porous high density plasma (HDP) oxide layers, it is possible to prevent etchant solution from flowing down to the polysilazane (PSZ) material (that is, the first insulating layer 116) through the porous high density plasma (HDP) oxide layer (that is, the second insulating layer 118 and the fourth insulating layer 122) during the subsequent etching process, and so the polysilazane (PSZ) material is not exposed and generation of a void in polysilazane (PSZ)

material is prevented. Due to the above-described phenomenon, the trench can be gap-filled without generation of a void.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The present invention as described above has the effects as follows.

First, by forming the third insulating layer between the second insulating layer and the fourth insulating layer formed of porous high density plasma (HDP) oxide layers, it is possible to prevent etchant solution from flowing to a polysilazane (PSZ) material through a porous high density plasma (HDP) oxide layer during a subsequent etching process, and so the polysilazane (PSZ) material is not exposed and generation of a void in polysilazane (PSZ) material is prevented.

Second, the generation of void is prevented so that it is possible to gap-fill the trench without generating a void.

What is claimed is:

1. A method of forming an isolation layer in a semiconductor device, comprising the steps of:
   providing a semiconductor substrate having an active area and an isolation area wherein a tunnel insulating layer and a charge storage layer are formed in the active area and a trench is formed in the isolation area;
   forming a first insulating layer by a spin coating method to fill the trench;
   removing a portion of the first insulating layer in the trench so that a to surface of the first insulating layer is lower than a top surface of the tunnel insulating layer;
   forming a second insulating layer along a surface of a resulting structure after removing the portion of the first insulating layer, thereby partially filling the trench with the second insulation layer, wherein a top surface of the second insulating layer is higher than a top surface of the tunnel insulating layer, and wherein the second insulating layer is a high density plasma (HDP) oxide layer;
   forming a third insulating layer along a surface of a resulting structure after forming the second insulating layer;
   forming a porous fourth insulating layer along a surface of a resulting structure after forming the third insulating layer, thereby fully filling the trench with the porous fourth insulating layer; and
   performing a polishing process to remove portions of the second, third, and porous fourth insulating layers in the active area;
   wherein the third insulating layer has a density higher than a density of the second insulating layer.

2. The method of forming an isolation layer in a semiconductor device of claim 1, further comprising the steps of, prior to forming the first insulating layer,
   forming a side wall insulating layer on the sidewalls and a bottom surface of the trench; and
   forming a liner insulating layer for filling a lower portion of the trench.

3. The method of forming an isolation layer in a semiconductor device of claim 1, wherein the first insulating layer is formed from polysilazane (PSZ) material.

4. The method of forming an isolation layer in a semiconductor device of claim 1, wherein the third insulating layer is formed to a thickness in a range of 50 angstroms to 300 angstroms.

5. The method of forming an isolation layer in a semiconductor device of claim 1, wherein the third insulating layer is formed from nitride or oxide, or has a structure formed by laminating nitride and oxide.

6. The method of forming an isolation layer in a semiconductor device of claim 5, wherein the oxide is high temperature oxide (HTO) or low pressure tetra ethyl ortho silicate (LP-TEOS).

7. The method of forming an isolation layer in a semiconductor device of claim 5, wherein the nitride is low pressure-silicon nitride (LP-SiN).

8. The method of forming an isolation layer in a semiconductor device of claim 1, wherein the third insulating layer is formed at a temperature in a range of 680 degrees Celsius to 780 degrees Celsius in a furnace.

9. The method of forming an isolation layer in a semiconductor device of claim 1, wherein the porous fourth insulating layer is formed of a high density oxide layer.

10. A method of forming an isolation layer in a semiconductor device, comprising the steps of:
    providing a semiconductor substrate having an active area and an isolation area wherein a tunnel insulating layer and a charge storage layer are formed in the active area and a trench is formed in the isolation area;
    forming a liner insulating layer on a surface of the trench;
    forming a first insulating layer on the liner insulating layer by a spin coating method to fill the trench;
    removing a portion of the first insulating layer in the trench so that a top surface of the first insulating layer is lower than a top surface of the tunnel insulating layer;
    forming a second insulating layer along a surface of a resulting structure after removing the portion of the first insulating layer, thereby partially filling the trench with the second insulation layer, wherein a top surface of the second insulating layer is higher than a top surface of the tunnel insulating layer, and wherein the second insulating layer is a high density plasma (HDP) oxide layer;
    forming a third insulating layer along a surface of a resulting structure after forming the second insulating layer;
    forming a porous fourth insulating layer along a surface of a resulting structure after forming the third insulating layer, thereby fully filling the trench with the porous fourth insulating layer; and
    performing a polishing process to remove a portion of the second, third, and fourth insulating layers in the active area,
    wherein the third insulating layer has a density greater than the density of the second insulating layer.

11. The method of forming an isolation layer in a semiconductor device of claim 10, further comprising the step of forming a side wall insulating layer on the sidewalls and a bottom surface of the trench before forming the liner insulating layer.

12. The method of forming an isolation layer in a semiconductor device of claim 10, wherein the liner insulating layer formed on a lower portion of the trench has a thickness greater than that of the liner insulating layer formed on the sidewalls of the trench.

13. The method of forming an isolation layer in a semiconductor device of claim 10, wherein the first insulating layer is formed from polysilazane (PSZ) material.

14. The method of forming an isolation layer in a semiconductor device of claim 10, wherein the third insulating layer is formed to a thickness in a range of 50 angstroms to 300 angstroms.

15. The method of forming an isolation layer in a semiconductor device of claim 10, wherein the third insulating layer is formed from nitride or oxide or has a structure formed by laminating nitride and oxide.

16. The method of forming an isolation layer in a semiconductor device of claim 15, wherein the oxide is high temperature oxide (HTO) or low pressure tetra ethyl ortho silicate (LP-TEOS).

17. The method of forming an isolation layer in a semiconductor device of claim 15, wherein the nitride is low pressure-silicon nitride (LP-SiN).

18. The method of forming an isolation layer in a semiconductor device of claim 10, wherein the third insulating layer is formed at a temperature in a range of 680 degrees Celsius to 780 degrees Celsius in a furnace.

19. The method of forming an isolation layer in a semiconductor device of claim 10, wherein the porous fourth insulating layer is formed of a high density plasma (HDP) oxide layer.

* * * * *